US012796417B2

(12) United States Patent
Yong et al.

(10) Patent No.: US 12,796,417 B2
(45) Date of Patent: Nov. 10, 2026

(54) SUBSTRATE PROCESSING METHOD

(71) Applicant: ASM IP Holding B.V., Almere (NL)

(72) Inventors: SangHeon Yong, Yongin-si (KR); HongSuk Kim, Yongin-si (KR); SungHa Choi, Suwon-si (KR); JuHyuk Park, Hwaseong-si (KR); KiHun Kim, Yongin-si (KR)

(73) Assignee: ASM IP Holding B.V., Almere (NL)

( * ) Notice: Subject to any disclaimer, the term of this patent is extended or adjusted under 35 U.S.C. 154(b) by 454 days.

(21) Appl. No.: 18/235,013

(22) Filed: Aug. 17, 2023

(65) Prior Publication Data

US 2024/0063053 A1 Feb. 22, 2024

Related U.S. Application Data

(60) Provisional application No. 63/399,800, filed on Aug. 22, 2022.

(51) Int. Cl.
*H10W 10/20* (2026.01)
*C23C 16/04* (2006.01)
(Continued)

(52) U.S. Cl.
CPC ........... *H10W 10/20* (2026.01); *C23C 16/045* (2013.01); *C23C 16/345* (2013.01);
(Continued)

(58) Field of Classification Search
CPC ........... H01L 21/02274; H01L 21/0228; H01L 21/0234; H01L 21/0217; H01L 21/02222; H01L 21/76224; H01L 21/02164; H01L 21/02211; H01L 21/02115; H01L 21/02126; H01L 21/76837; H01L 21/02219; H01L 21/02118; H01L 21/02167; H01L 21/02326; H01L 21/0214; H01L 21/02205; H01L 21/0223; H01L 21/02337; H01L 21/02348; H01L 21/022; H01L 21/02208; H01L 21/02216; H01L 21/02271; H01L 21/02277; H01L 21/31122; H01L 21/76229; H01L 21/764; H01L 21/0201; H01L 21/02112; H01L 21/02183; H01L 21/02186; H01L 21/02236; H01L 21/02252; H01L 21/02315; H01L 21/02359; H01L 21/56;
(Continued)

(56) References Cited

U.S. PATENT DOCUMENTS 8,278,224 B1 * 10/2012 Mui ........................ B05C 11/00 438/778
8,557,712 B1 * 10/2013 Antonelli .......... H01L 21/76828 438/789
2013/0230987 A1 * 9/2013 Draeger ............ H01L 21/02164 438/694

* cited by examiner

*Primary Examiner* — Julio J Maldonado
*Assistant Examiner* — Kenneth S. Stephenson
(74) *Attorney, Agent, or Firm* — Snell & Wilmer L.L.P.

(57) ABSTRACT

A method of processing a substrate is disclosed, the method including: providing the substrate where a gap is formed on a surface thereof to a reaction space, performing a deposition step of depositing a flowable film in the gap of the substrate while supplying a precursor and a reactant gas to the reaction space, performing a plasma treatment step to the flowable film so that the flowability of the flowable film in an upper region of the gap decreases compared to a lower region of the gap, and repeating the deposition step of depositing the flowable film and the plasma treatment step to the flowable film, to form an air-gap within the gap.

23 Claims, 16 Drawing Sheets

(51) Int. Cl.

| | |
|---|---|
| ***C23C 16/34*** | (2006.01) |
| ***C23C 16/505*** | (2006.01) |
| ***H01J 37/32*** | (2006.01) |
| ***H10P 14/60*** | (2026.01) |
| ***H10W 10/00*** | (2026.01) |
| ***H10W 10/17*** | (2026.01) |

(52) U.S. Cl.
CPC ...... *C23C 16/505* (2013.01); *H01J 37/32137* (2013.01); *H10P 14/6336* (2026.01); *H10W 10/014* (2026.01); *H10W 10/021* (2026.01); *H10W 10/17* (2026.01); *H01J 2237/332* (2013.01)

(58) Field of Classification Search
CPC ......... H01L 21/67103; H01L 21/67109; H01L 21/67167; H01L 21/6719; H01L 21/67207; H01L 21/67248; H01L 21/67745; H01L 21/7682; H01L 21/76834; H01L 23/14; C23C 16/045; C23C 16/56; C23C 16/505; C23C 16/345; C23C 16/52; C23C 16/45542; C23C 16/26; C23C 16/45523; C23C 16/45536; C23C 16/45553; C23C 16/50; C23C 16/401; C23C 16/45544; C23C 16/45557; C23C 16/36; C23C 16/45527; C23C 16/45538; C23C 16/46; C23C 16/515; C23C 14/0036; C23C 14/048; C23C 14/0605; C23C 16/02; C23C 16/30; C23C 16/325; C23C 16/402; C23C 16/45525; C23C 16/4554; C23C 16/482; C23C 16/509; C23C 16/5096; C23C 16/511; C23C 16/517; C23C 16/54; H01J 37/32449; H01J 2237/3321; H01J 37/3244; H01J 2237/332; H01J 37/32146; H01J 37/32724; H01J 2237/3323; H01J 2237/3382; H01J 37/32091; H01J 37/32137; H01J 37/32201; H01J 37/32834; H01J 37/32899; H10W 10/20; H10W 10/021; H10W 10/014; H10W 10/17; H10W 20/072; H10W 20/46; H10P 14/6336; H10P 14/6334; H10P 14/6339; H10P 14/6681; H10P 14/6682; H10P 14/6689; H10P 14/69215; H10P 14/69433; H10P 14/6516; H10P 14/6546; H10P 14/6544; H10P 14/6532
See application file for complete search history.

SUBSTRATE PROCESSING METHOD

CROSS-REFERENCE TO RELATED APPLICATIONS

This application claims priority to U.S. Provisional Patent Application Ser. No. 63/399,800 filed Aug. 22, 2022 titled SUBSTRATE PROCESSING METHOD, the disclosure of which is hereby incorporated by reference in its entirety.

BACKGROUND

1. Field

The present disclosure relates to a method of processing a substrate, and more particularly, to a method of forming an air-gap inside a gap formed on a surface of the substrate.

2. Description of the Related Art

A gap-fill process is widely used in a semiconductor manufacturing process and referred to a filling process for filling a gap in a gap structure, such as a shallow trench isolation (STI) with an insulating material, for example. On the other hand, as the degree of integration of semiconductor devices increases, the aspect ratio of the gap in the gap structure is also increasing rapidly, and accordingly, it becomes an important concern to rapidly fill the inside of the gap having a high aspect ratio (A/R) without forming a void in it.

Meanwhile, in recent years, the demand for highly integrated semiconductor devices with high performance has been growing. In highly integrated semiconductor devices, conductive patterns formed of various materials and shapes are formed on each layer of a multilayer integrated circuit structure, and in order to secure an insulation between these conductive patterns, interlayer insulating films formed of various materials and shapes are provided between the conductive patterns. In particular, with the progress of highly integrated semiconductor devices, the sizes of the conductive patterns and the spacing between them are gradually reduced. A reduction in the size of the conductive pattern increases the resistance of the conductive pattern, and a reduction in the spacing between the conductive patterns increases the capacitance between the conductive patterns with the interlayer insulating film therebetween. This increase in resistance and capacitance causes a delay in signal transmission called Resistance Capacitance (RC) delay. Therefore, in order to speed up the speed of the signal transmission in semiconductor devices, insulating materials having low dielectric constant are required along with conductive materials having low resistance. Along with the demand for insulating materials with low dielectric constant, attempts have been made to use air-gaps with a very low dielectric constant of '1' together with insulating materials.

Therefore, for a high speed semiconductor device with a high film forming rate in a gap-fill process, a substrate processing method for forming the air-gap in the gap having a high aspect ratio using a flowable chemical vapor deposition (FCVD) is required.

SUMMARY

The present disclosure provides a substrate processing method for forming an air-gap in a gap while filling the gap with a flowable film in a gap-fill process.

The present disclosure provides a substrate processing method for adjusting the position and size of an air-gap in a gap.

Additional aspects will be set forth in part in the description which follows and, in part, will be apparent from the description, or may be learned by practice of the presented embodiments of the disclosure.

According to an aspect of the present disclosure, there is provided a method of processing a substrate, the method including: providing the substrate where a gap is formed on a surface thereof to a reaction space, performing a first deposition step of depositing a flowable film in the gap of the substrate while supplying a precursor and a reactant gas to the reaction space, performing a first plasma treatment step to the flowable film so that a flowability of the flowable film in an upper region of the gap is different from the flowability of the flowable film in a lower region of the gap; performing a second deposition step of depositing the flowable film in the gap of the substrate while supplying the precursor and the reactant gas to the reaction space, performing a second plasma treatment step to the flowable film so that the flowability of the flowable film in the upper region of the gap is different from the flowability of the flowable film in the lower region of the gap, and repeating the first deposition step, the first plasma treatment step, the second deposition step, and the second plasma treatment step, to form an air-gap in the gap.

In some embodiments, the first plasma treatment step and the second plasma treatment step may be performed under the same process conditions. In some embodiments, the first plasma treatment step and the second plasma treatment step may be performed under different process conditions. In some embodiments, the first RF power in the first plasma treatment step may be different from the second RF power in the second plasma treatment step.

In some embodiments, at least one of the first plasma treatment step and the second plasma treatment step may be performed so that the flowability of the flowable film in the upper region of the gap decreases compared to the flowability of the flowable film in the lower region of the gap.

In some embodiments, both the first plasma treatment step and the second plasma treatment step may be performed to decrease the flowability of the flowable film in the upper region of the gap compared to the lower region of the gap, and wherein the degree of decrease in the flowability of the flowable film in the upper region of the gap in the second plasma treatment step may be greater compared to the first plasma treatment step. In some embodiments, the second RF power applied to the reaction space in the second plasma treatment step may be greater than the first RF power applied to the reaction space in the first plasma treatment step.

In some embodiments, both the first plasma treatment step and the second plasma treatment step may be performed to decrease the flowability of the flowable film in the upper region of the gap compared to the lower region of the gap, and wherein the degree of decrease in the flowability of the flowable film in the upper region of the gap in the second plasma treatment step may be less compared to the first plasma treatment step. In some embodiments, the second RF power applied to the reaction space in the second plasma treatment step may be less than the first RF power applied to the reaction space in the first plasma treatment step.

In some embodiments, in the first plasma treatment step and the second plasma treatment step, a direct plasma treatment may be performed while supplying an inert gas to the reaction space.

In some embodiments, the precursor supplied to the reaction space may include a silicon-containing precursor and the reactant gas may include a nitrogen-containing gas, for example, $NH_3$.

In some embodiments, the first deposition step and the second deposition step for depositing the flowable film may be performed in a range of a process temperature between about 0° C. and about 150° C.

In some embodiments, the first deposition step, the first plasma treatment step, the second deposition step, and the second plasma treatment step may be continuously performed.

In some embodiments, after the first deposition step and the first plasma treatment step may be continuously performed for M cycle (M is a positive integer), and then the second deposition step and the second plasma treatment step may be continuously performed for N cycle (N is a positive integer).

According to an aspect of the present disclosure, there is provided a method of processing a substrate, the method including: providing the substrate where a gap is formed on a surface thereof to a reaction space, performing a deposition step of depositing a flowable film in the gap of the substrate while supplying a precursor and a reactant gas to the reaction space, performing a plasma treatment step to the flowable film so that the flowability of the flowable film in an upper region of the gap may be reduced compared to a lower region of the gap, and repeating the deposition step of depositing the flowable film and the plasma treatment step to the flowable film, to form an air-gap within the gap.

In some embodiments, in the plasma treatment step, a vertical position of the air-gap in the gap may be adjusted by adjusting the intensity of the RF power applied to the reaction space compared to a reference RF power. In some embodiments, in the plasma treatment step, a height between an upper end of the air-gap and an upper surface of the gap may be adjusted by adjusting the intensity of the RF power applied to the reaction space compared to the reference RF power.

In some embodiments, in the plasma treatment step, a height between a lower end of the air-gap and a bottom surface of the gap may be adjusted by adjusting the intensity of the RF power applied to the reaction space compared to the reference RF power. In some embodiments, in the plasma treatment step, a width of the air-gap in the gap may be adjusted by adjusting the intensity of the RF power applied to the reaction space compared to a reference RF power.

In some embodiments, in the plasma treatment step, the RF power applied to the reaction space may be in a range of about 200 W to about 1000 W. In some embodiments, the ratio of the process time of the deposition step to the process time of the plasma treatment step may be between about 1:1 to about 100:1. In some embodiments, the deposition step of depositing the flowable film and the plasma treatment step to the flowable film may be performed in a range of a process temperature between about 0° C. and about 150° C., preferably, a process temperature between about 20° C. and about 100° C.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
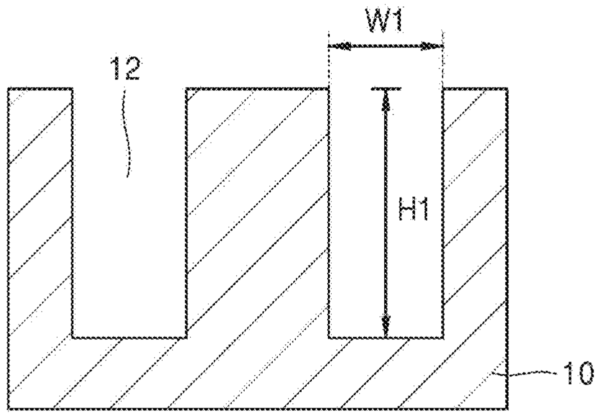
FIGS. 1A to 1D are cross-sectional views conceptually illustrating a process of filling a gap with a flowable film.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings.

Embodiments of the present disclosure are provided to further explain the present disclosure to one of ordinary skill in the art, and the following embodiments may have different forms and the scope of the present disclosure should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any particular order, upper and lower, or importance, but rather are only used to distinguish one member, region, layer, and/or section from another member, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

First, according to a flowable chemical vapor deposition method, a substrate processing method for performing a gap-fill process to fill a gap on a substrate with a flowable film, for example, a silicon nitride film is described. FIGS. 1A to 1D are cross-sectional views conceptually illustrating a conventional process of filling a gap with a flowable film.

Referring to FIG. 1A, a substrate 10 provided to a reaction space (not shown) in which the gap-fill process according to example embodiments of the present disclosure may be performed, is shown. On a part of the surface of the substrate 10, a gap structure including a gap 12 that may have a certain depth H1 in a vertical direction and a certain width W1 in a horizontal direction is shown.

Figure 1B:
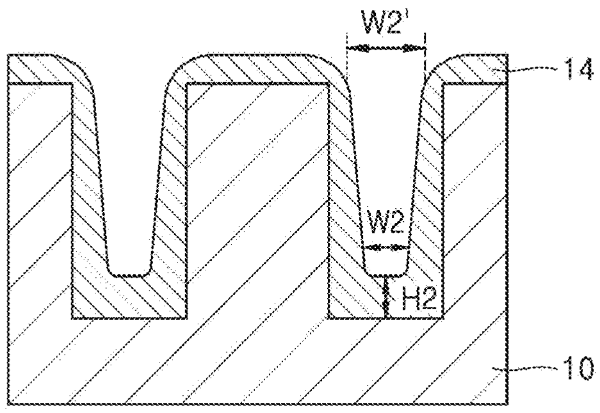

Referring to FIG. 1B, when RF power is applied while supplying a silicon precursor and a reactant gas to the reaction space, a flowable film 14, such as a silicon nitride film, may be deposited on an exposed surface of the substrate 10 including the gap 12, through a condensation reaction and a polymerization reaction between the silicon precursor and the reactant gas. The flowable properties of flowable film 14 may cause the flowable film 14 to flow down from an upper region of the gap 12 to a lower region of the gap 12, thereby depositing the flowable film 14 in the gap 12, and accordingly, in a width of an inner space between the flowable films 14 to be deposited in the gap 12, a width W2 in the lower region region becomes less than a width W2' in the upper region of the gap 12.

Figure 1C:
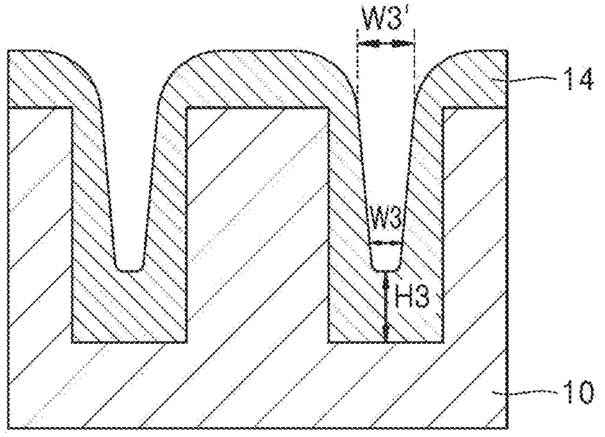
Figure 1D:
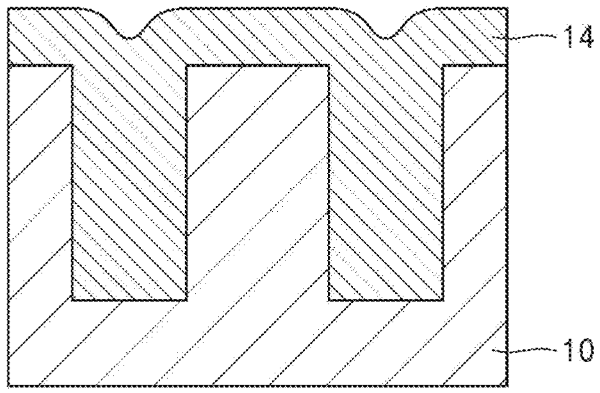

Referring to FIG. 1C, as a deposition process further proceeds, since the flowable film 14 may be deposited in the gap 12 while the flowable film 14 flows down from the upper region of the gap 12 to the lower region of the gap 12, in the width of the inner space between the flowable films 14 to be deposited in the gap 12, a width W3 in the lower region region becomes less than a width W3' in the upper region of the gap 12. Referring to FIG. 1D, as the deposition process of the flowable film further proceeds, the gap 12 may be completely filled with the flowable film 14 without the occurrence of a void inside.

On the other hand, inventors of the present application have been conducting a research to achieve a fast response time of the semiconductor device, despite a pattern structure having a high aspect ratio, for example, a gap structure, in a situation in which high integration and high performance of the semiconductor devices are required. In order to perform a smooth gap-fill process for the gap structure having a high aspect ratio and at the same time, reduce a signal transmission delay problem called RC delay, which acts as an important factor for speeding up the signal transmission of semiconductor device, the present inventors have developed an air-gap structure having a very low dielectric constant in an insulating material filled in the gap structure. Hereinafter, example embodiments of the present disclosure that incorporate the air-gap in the gap having the high aspect ratio will be described in detail below.

FIGS. 2A to 2D are cross-sectional views illustrating a process sequence of forming the air-gap in the gap according to example embodiments of the present disclosure.

Figure 2A:
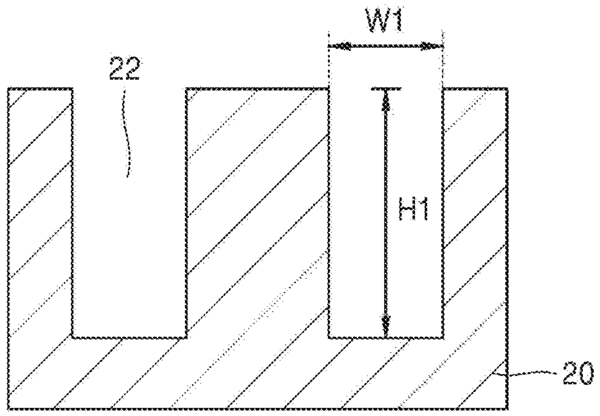
FIGS. 2A to 2D are cross-sectional views illustrating a process sequence of forming an air-gap in a gap according to example embodiments of the present disclosure.

Referring to FIG. 2A, a substrate 20 provided to a reaction space (not shown), for example a reaction chamber, in which a gap-fill process according to example embodiments of the present disclosure may be performed, is shown. On a part of a surface of the substrate 20, a gap structure including a gap 22 that may have a depth H1 in a vertical direction and a width W1 in a horizontal direction is shown. The substrate 20 may include semiconductor materials such as Si or Ge, or various compound semiconductor materials such as SiGe, SiC, GaAs, InAs, and InP, and may include various substrates to be used in a display device or a semiconductor device, etc., such as silicon on insulator (SOI), silicon on sapphire (SOS).

The gap 22 used in the present disclosure may refer to a gap in the broadest sense, and may refer to a certain space surrounded by a surrounding structure defining the gap, in which at least an upper side thereof is exposed. For example, the gap 22 may be a recess region having various geometries formed on the surface of the substrate 20, including a shallow trench isolation (STI) region, which is generally used as a device isolation region to define an active region in a semiconductor manufacturing process. In addition, the gap 22 may also be in the form of a via that penetrates a conductive layer between an insulating layer and another insulating layer, or penetrates an insulating layer between a conductive layer and another conductive layer. In addition, the gap 22 may be a gap formed by removing a portion of a single or multi-layered specific material layer (not shown) formed on the surface of the substrate 20 by etching. The material layer (not shown) may include, for example, a conductive material, an insulating material, or a semiconductor material, or the like. Further, the gap 22 may be a cylindrical shape, but the cross-sectional shape of the surface of the gap 22 may have various polygonal shapes such as an elliptical, triangular, rectangular, or pentagon, and the like. In addition, the gap 22 may have an island shape having various surface cross-sectional shapes, but in some embodiments, the gap 22 may have a line shape on the substrate 20. Further, the gap 22 may have a vertical profile having substantially the same width from an upper region of the gap 22, which is an inlet region of the gap 22, to a lower region thereof. In some embodiments, the gap 22 may have a non-vertical profile in which the width of the gap 22 increase or decreases linearly or stepwise from the upper region of the gap to the lower region thereof.

Figure 2B:
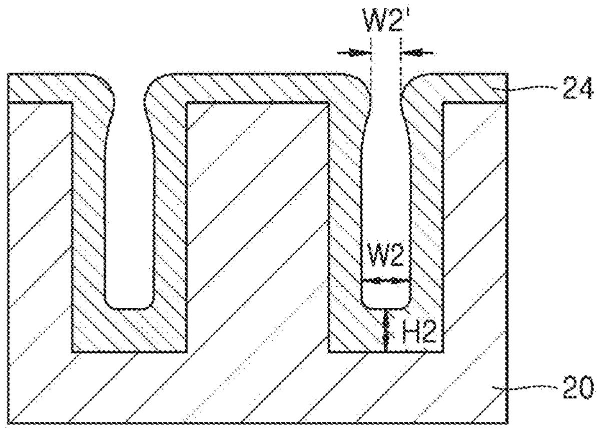

Although FIG. 2A shows a case in which the gap 22 is formed in the substrate 20 itself, the substrate herein may refer purely to only the substrate 20, or may refer to a substrate having various geometric surfaces before a flowable film 24 shown in FIG. 2B is formed thereon according to the present disclosure.

Referring to FIG. 2B, the flowable film 24 may be formed on the exposed surface of the substrate 20, including the gap 22. The flowable film 24 may include an insulating film having the flowable properties, for example a nitride film, an oxide film, or an oxynitride film, etc. Comparing the flowable film 24 of FIG. 2B to the flowable film 14 of FIG. 1B, both are identical in that they are flowable films, for example, the silicon nitride film, respectively formed on the exposed surfaces of the substrates 10 and 20 including the gaps 12 and 22 through a condensation reaction, an oligomerization reaction and a polymerization reaction between a precursor and a reactant gas by applying RF power while supplying the precursor (e.g., a silicon precursor) and the reactant gas (e.g., a nitrogen-containing gas) to the reaction spaces.

However, in a case of FIG. 1B, the flowable properties of flowable film 14 may cause the flowable film 14 to flow down from the upper region of the gap 12 to a lower region of the gap 12, thereby forming the flowable film 14 in the gap 12, and accordingly, in a width of an inner space between the flowable films 14 to be formed in the gap 12, a width W2 in the lower region of the gap 12 may become less than a width W2' in the upper region thereof. On the other hand, in the case of FIG. 2B, a portion of the flowable film 24 may flow down from the upper region of the gap 22 to the lower region thereof due to the flowable properties of the flowable film 24, however, in the width of the inner space between the flowable films 24 to be deposited in the gap 22, the width W2 in the lower region of the gap 22 may become greater than the width W2' in the upper region thereof, unlike the case of FIG. 1B.

A step of forming the flowable film 24 shown in FIG. 2B may be performed including a deposition step of depositing the flowable film 24 and a plasma treatment step to the flowable film 24. A deposition step of depositing the flowable film 24 may be performed using, for example, a flowable chemical vapor deposition method (FCVD), in which a plasma environment may be generated by applying RF power to the reaction space while supplying the silicon precursor and the reactant gas to the reaction space and in the plasma environment, the flowable film 24 may be formed on the exposed surface of the substrate 20 through the condensation reaction, the oligomerization reaction and the polymerization reaction between the silicon precursor and the reactant gas. At this time, the flowable film 24 may be flowed down to the lower region of the gap 22 due to the flowable properties of the flowable film 24 under the influence of gravity. That is, the flowable film 24 may be formed with any thickness on a side wall and a bottom surface of the gap 22 as well as the surface of the substrate 20 surrounding the gap 22, and at the same time, due to the flowable properties of the flowable film 24, the flowable film 24 may flow downwardly to the lower region of the gap 22 along the side wall of the gap 22 with any flowability.

Subsequently, after the flowable film 24 is formed by any thickness, the plasma treatment step to the flowable film 24 may be performed. The plasma treatment step may be performed using a direct plasma treatment that may generate a plasma directly on the flowable film 24 while supplying an inert gas such as, helium to the same reaction space (not shown). When the plasma processing according to an example embodiments of the present disclosure for the flowable film 24 is performed, the flowability of the flowable film 24 may be deteriorated.

In a general plasma-enhanced chemical deposition (PECVD) method, since precursors or reactant gases are exposed to plasma and then decomposed, the condensation reaction, the oligomerization reaction, and the polymerization reaction, etc. may not proceed smoothly, so that the formation of the flowable film may not be smooth.

However, in the flowable chemical vapor deposition method (FCVD), instead of decomposing the precursors and the reactant gases when plasma is applied, a radical-based reaction may induce the condensation reaction, the oligomerization reaction, and the polymerization reaction to form the flowable film. That is, a functional group (e.g., —OH, —H) may be formed at terminated sites of the flowable film by radicals, resulting in the condensation and polymerization reactions, and the flowable properties of a film may be generated.

On the other hand, as example embodiments of the present disclosure for forming an air gap in the gap structure, when the plasma treatment to the flowable film proceeds, the functional group (e.g., —OH, —H, etc.) of the terminated sits of the flowable film may be removed. Therefore, the condensation reaction, the oligomerization reaction, and the polymerization reaction may be suppressed, and therefore, the flowability of the film may be deteriorated. The fact that the flowability is deteriorated means that the flowability of the flowable film deposited becomes smaller, and thus, in the case of FIG. 2B illustrating example embodiments of the present disclosure, the fact means that the extent to which the flowable film 24 flows down toward the lower region of the gap 22 becomes smaller.

Therefore, as conceptually shown in FIG. 2B, when the direct plasma treatment according to the example embodiments of the present disclosure is performed to the flowable film 24 formed on the exposed surface of the substrate 20 in the deposition step of depositing a flowable film described above, the flowable film 24 deposited in the upper region of the gap 22 having, in particular, a very large aspect ratio may be more affected by the plasma treatment compared to the lower region of the gap 22, and as a result, the flowability of the flowable film 24 deposited in the upper region thereof may be relatively deteriorated, and thus the flowability thereof may become relatively smaller. As a result, as shown in FIG. 2B, as the extent to which the flowable film 24 deposited in the upper region of the gap 22 flows down toward the lower region of the gap 22 may decrease, the thickness of the flowable film 24 deposited in the upper region of the gap 22, that is, in the inlet region of the gap 22 may increase. That is, as shown in FIG. 2B, the width W2' in the horizontal direction of the gap 22 that is not filled with the flowable film 24 in the upper region of the gap 22, that is, in the inlet region, may become less than the width W2 in the horizontal direction of the gap 22 that is not filled with the flowable film in the lower region thereof. In FIG. 2B, height H2 refers to the thickness of the flowable film 24 measured in a vertical direction from the bottom surface of the gap 22.

Herein, the above-described deposition step of depositing the flowable film 24 and the plasma treatment step to the flowable film 24 may be defined as one cycle. The deposition step of depositing the flowable film 24 and the plasma treatment step to the flowable film 24 may be performed continuously within the same reaction space, which is described in detail later.

Figure 2C:
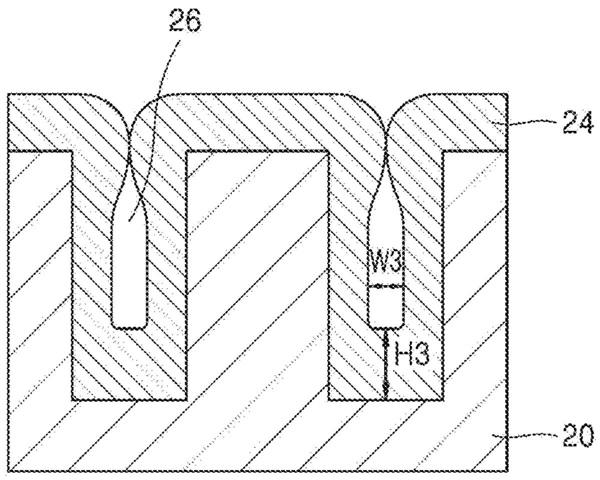

Then, referring to FIG. 2C, a step of forming the flowable film 24 may be performed by repeating the cycle including the deposition step of depositing the flowable film 24 and the plasma treatment step to the flowable film 24 a plurality of times. The deposition step of depositing the flowable film 24 and the plasma treatment to the flowable film 24 may be repeatedly performed until at least the flowable films 24 contact with each other in the inlet region of the gap 22 to form an air-gap 26 inside the gap 22. Optionally, even after a first contact between the flowable films 24, the deposition step of depositing the flowable film 24 and the plasma treatment step to the flowable film 24 may be additionally performed as appropriate until the size or shape of the air-gap 26 in the gap 22 is stabilized to some extent as intended. As shown in FIG. 2C, as the deposition step of depositing the flowable film 24 and the plasma treatment step to the flowable film 24 further progress, the width W3 of the air-gap 26 formed in a middle region of the gap 22 may also become less than the width W2 in the horizontal direction of FIG. 2B, and the height H3, which shows the thickness of the flowable film 24 below the air-gap 26, may also become greater than the height H2 in FIG. 2B.

Figure 2D:
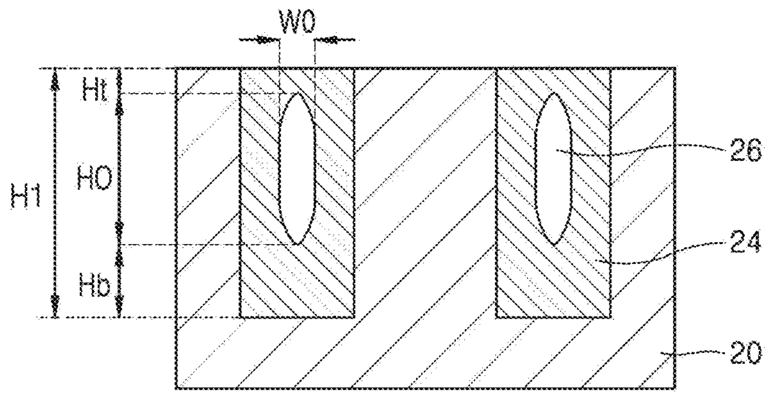

Referring to FIG. 2D, in order that the air-gap 26 in the gap 22 may have a stable size and shape and may be formed at a desired position in the gap 22, after sufficiently repeatedly performing the deposition step of depositing the flowable film 24 and the plasma treatment step to the flowable film 24 according to example embodiments of the present disclosure, a surface planarization process may be performed until the surface of the substrate 20 is exposed. The surface planarization process may be performed through an etch-back process or a chemical mechanical polishing (CMP) process.

The air-gap 26 shown in the cross section in FIG. 2D may be in the form of an inner space extending long in the vertical direction with a maximum horizontal width W0 and a maximum vertical height H0, but the shape of the air-gap 26 is not limited thereto. In addition, the vertical location of the air-gap 26 may be such that a lower end of the air-gap 26 is located above a height Hb from the bottom surface of the gap 22, and an upper end thereof is located below a height Ht from an upper surface of the gap 22. The overall height of the gap 22 corresponds to H1 (see FIG. 2A). The control of the size, shape, and position of the air-gap 26 will be described later.

Figure 3:
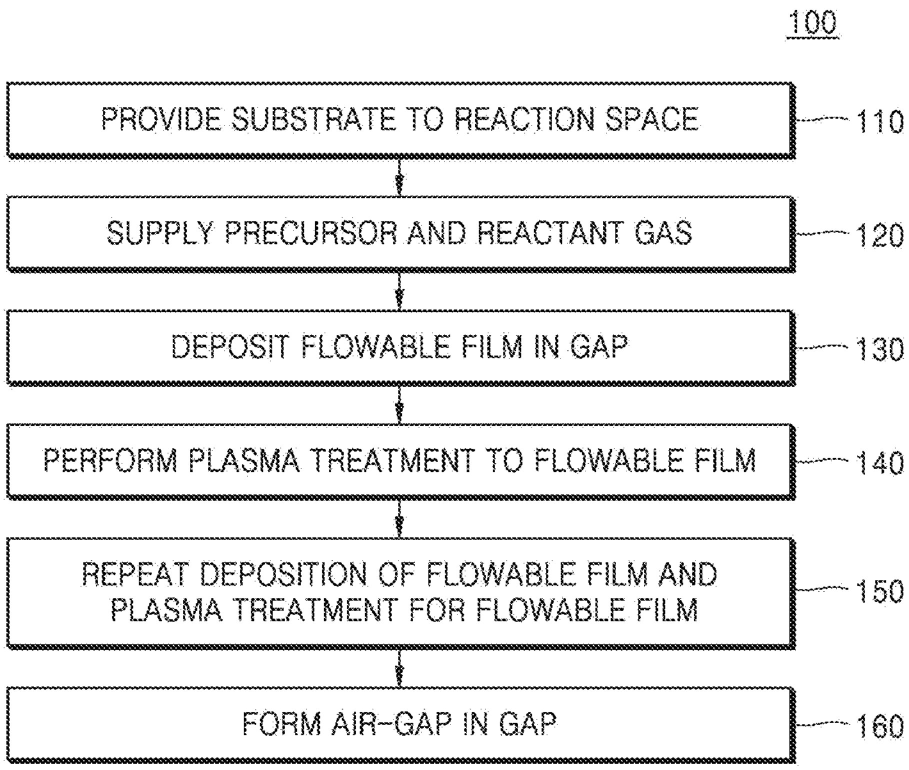
FIG. 3 is a flow chart illustrating a process of forming an air-gap in a gap according to example embodiments of the present disclosure.

FIG. 3 is a flow chart illustrating a process 100 of forming an air-gap in a gap according to example embodiments of the present disclosure. The process of forming the air-gap in the gap according to the example embodiments of the present disclosure will be described, together with reference to FIGS. 2A to 2D showing the process sequence of forming the air-gap in the gap.

First, the substrate 20 having the gap 22 structure may be provided (110) to a reaction space (not shown). The reaction space may be a reaction chamber that may perform a substrate processing process according to the example embodiments of the present disclosure. Specifically, the reaction space may be a plasma reaction chamber in which example embodiments of the present disclosure may be performed. Preferably, the reaction space may be a direct plasma reaction chamber that may generate plasma directly near the upper surface of the substrate 20.

Subsequently, the precursor and the reactant gas may be supplied to the reaction space in which the substrate 20 is provided (120). As the precursor, a silicon-containing precursor may comprise, but is not limited thereto, at least one of amino-silane series, iodosilane series, silicon halide series and oligomer Si source may be used. For example, the Si source may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiH_3$; $SiH_2I_2$; Dimer-trisilylamine; Trimer-trisilylamine; Tetramer-trisilylamine; Pentamer-trisilylamine; Hexamer-trisilylamine; Heptamer-trisilylamine; Octamer-trisilylamine, or its derivatives or mixtures thereof. The reactant gas may include, for example, nitrogen-containing gases. The nitrogen containing gases may comprise, but are not limited thereto, at least one selected from $N_2$, $N_2O$, $NO_2$, $NH_3$, $N_2H_2$, $N_2H_4$, at least one of radicals thereof, and mixtures thereof. In this embodiment, for example, the $NH_3$ gas may be used. The precursor and the reactant gas may be supplied with an argon gas as a carrier gas.

Subsequently, the flowable film 24 may be deposited in the gap 22 (130). The flowable film 24 may be deposited under the plasma environment generated by applying RF power to the reaction space while supplying the precursor and the reactant gas to the reaction space. The process time for depositing the flowable film 24 may be controlled so that the flowable film 24 may be formed on the exposed surface of the substrate 20 with an appropriate thickness. The deposition step of depositing the flowable film 24 may be performed substantially at the same step as a step of supplying the precursor and the reactant gas to the reaction space.

Subsequently, the plasma treatment may be performed to the flowable film 24 deposited on the surface of the substrate 20 (140). The plasma treatment step may be performed by generating plasma directly above the substrate 20 by applying RF power to the reaction space while supplying an inert gas, for example, a helium gas, to the reaction space in a state in which the supply of the precursor and the reaction gas to be supplied to the reaction space may be stopped. By performing the plasma treatment to the flowable film 24, as described above, the flowability of the flowable film 24 may be deteriorated. In particular, as the aspect ratio of the gap 22 increases, the upper region of the gap 22, that is, the inlet region thereof may be more affected by the plasma than the lower region of the gap 22. Accordingly, the degree of deterioration of the flowability of the flowable film 24 deposited on the upper region of the gap 22 may be greater than the degree of deterioration of the flowability of the flowable film 24 deposited on the lower region thereof, so that the flow of the flowable film 24 toward to the lower region of the gap 22 may decrease. As a result, the thickness of the flowable film 24 deposited on the upper region of the gap 22 may increase as shown in FIG. 2B.

Subsequently, the deposition step of depositing the flowable film 24 and the plasma treatment step to the flowable film 24 may be repeated 150. The deposition step of depositing the flowable film 24 and the plasma treatment step to the flowable film 24 may be performed in one cycle, and the deposition step of depositing the flowable film 24 and the plasma treatment step to the flowable film 24 may be performed by N cycles (wherein, N is a positive integer), until the flowable films 24 are in contact with each other in the upper region, that is, the inlet region of the gap 22 to close the inlet region of the gap 22, as shown in FIG. 2C.

Accordingly, as a result of repeating the deposition step of depositing the flowable film 24 and the plasma treatment step to the flowable film 24, the air-gap 26 may be formed in the gap 22 (160). After the air-gap 26 is formed in the gap 22, if necessary, the cycle may further proceed to optimally form the size, shape, position, etc. of the air-gap 26. After the desired air-gap 26 is formed, if necessary, the surface planarization process of removing a portion of the flowable film 24 remaining on an upper side of the gap 22 structure, may be performed to expose the surface of the substrate 20.

Figure 5:
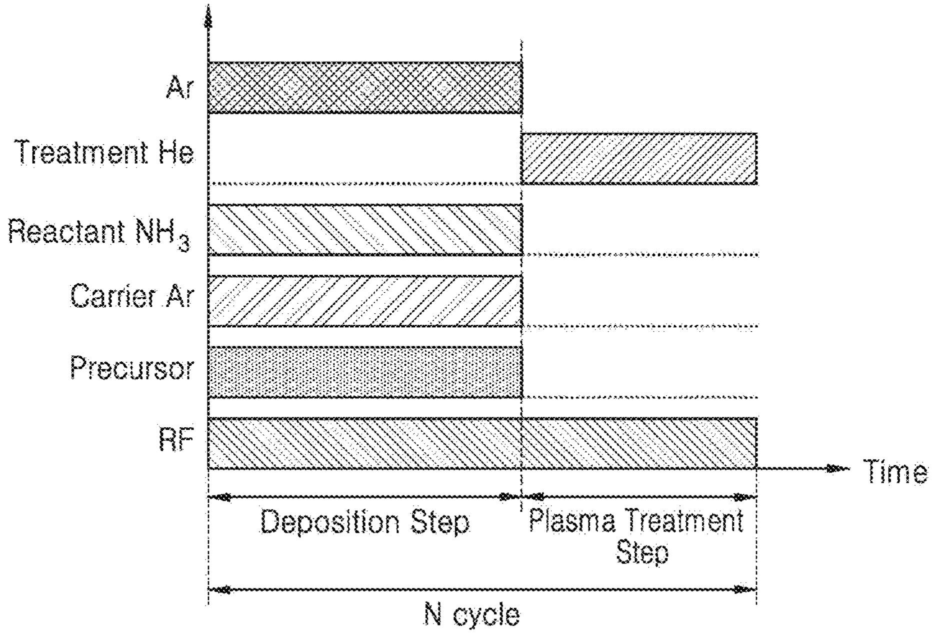
FIG. 5 is a diagram illustrating a process sequence of a method for forming an air-gap in a gap according to example embodiments of the present disclosure.

FIG. 5 is a diagram illustrating a process sequence of a method for forming an air-gap according to example embodiments of the present disclosure. FIG. 5 shows, as the process sequence of the method for forming the air-gap within the gap, the diagram conceptually illustrating a deposition step of depositing the flowable film which is a formation process of the flowable film, and a plasma treatment step to the flowable film.

Referring to FIG. 5, together with FIGS. 2A to 2D and 3, the process of forming the flowable film 24 of the present disclosure may include the deposition step and the plasma treatment step. Specifically, the deposition step may correspond to the step 130 of depositing the flowable film in the gap in FIG. 3, and the plasma treatment step may correspond to the step 140 of plasma treatment to the flowable film in FIG. 3.

Referring to FIG. 5, the deposition step may be to deposit the flowable film 24 in the gap 22. In the deposition step, the precursor (e.g., silicon source) and the nitrogen-containing gas (e.g., $NH_3$ gas) may be supplied together to the reaction space. At this time, the silicon source may be carried by an argon gas as a carrier gas, and in the reaction space, a purge gas, such as argon gas, may continuously flow. In the deposition step, an RF power may be applied to the reaction space to form a plasma environment.

Specifically, in the deposition step, the silicon-containing source as the precursor may be supplied at a flow rate of greater than 0 sccm to about 3000 sccm, preferably about 500 sccm to about 2000 sccm, and the $NH_3$ gas as the reactant gas may be supplied at the flow rate of greater than 0 sccm to about 2500 sccm, preferably about 200 sccm to about 2000 sccm. As a plasma condition in the deposition step, the RF power may be in a range of greater than 0 W to about 500 W, and the RF frequency may be in a range of about 10 MHz to about 60 MHz. The process pressure in the deposition step may be in a range of about 1.0 Torr to about 9.0 Torr, and the process temperature may be in a range of about 0° C. to about 150° C.

On the other hand, the plasma treatment step may be performed as a subsequent process after the deposition step is terminated. That is, the plasma treatment step in a state in which the supply of the precursor and the reaction gas to be supplied to the reaction space may be stopped may be performed in the same reaction space by applying RF power to the reaction space to activate the inert gas and generate plasma while supplying the inert gas, for example, helium gas, to the reaction space.

In another optional embodiment, after performing the deposition step and before performing the plasma treatment step, a purge/pumping step may be added. After the purge/pumping step, the plasma treatment step may be performed by applying RF power when supplying the inert gas such as helium gas to the reaction space.

Specifically, in the plasma treatment step, the helium gas as the inert gas may be supplied at a flow rate in a range of greater than 0 sccm to about 3000 sccm, preferably about 200 sccm to about 2000 sccm, more preferably about 500 sccm to about 1500 sccm. As the plasma condition in the plasma treatment step, the RF power may be in a range of greater than 0 W to about 1500 W, preferably about 200 W to about 1000 W, and the RF frequency may be in a range of about 10 MHz to about 60 MHz. The process pressure in the plasma treatment step may be in a range of about 1.0 Torr to about 9.0 Torr, preferably in the range of about 1.0 Torr to about 7.0 Torr, and the process temperature may be in a range of about 0° C. to about 150° C., preferably about 20° C. to about 100° C. The process time in the plasma treatment step may be in a range of about 0.1 seconds to about 1800 seconds, preferably about tens of seconds to about hundreds of seconds.

Processing conditions in the deposition step and the plasma treatment step are summarized in Table 1 below.

TABLE 1

| Step | | Items | Conditions |
|---|---|---|---|
| Deposition | Gas (sccm) | Carrier Ar | 0 to 3000 (preferably 500 to 2000) |
| | | Reactant $NH_3$ | 0 to 2500 (preferably 200 to 2000) |
| | | Precursor | 0 to 3000 (preferably 500 to 2000) |
| | | Ar | 0 to 3000 |
| | Plasma condition | RF Power(W) | 0 to 500 |
| | | RF Frequency(MHz) | 10 to 60 |
| | Process pressure (Torr) | | 1.0 to 9.0 |
| | Process Temp (° C.) | | 0 to 150 |
| Treatment | Gas (sccm) | He | 0 to 3000 (preferably 200 to 2000) |
| | Plasma condition | RF Power(W) | 0 to 1500 |
| | | RF Frequency(MHz) | 10 to 60 |
| | Process pressure (Torr) | | 1.0 to 9.0 |
| | Process Temp (° C.) | | 0 to 150 |

Figure 6:
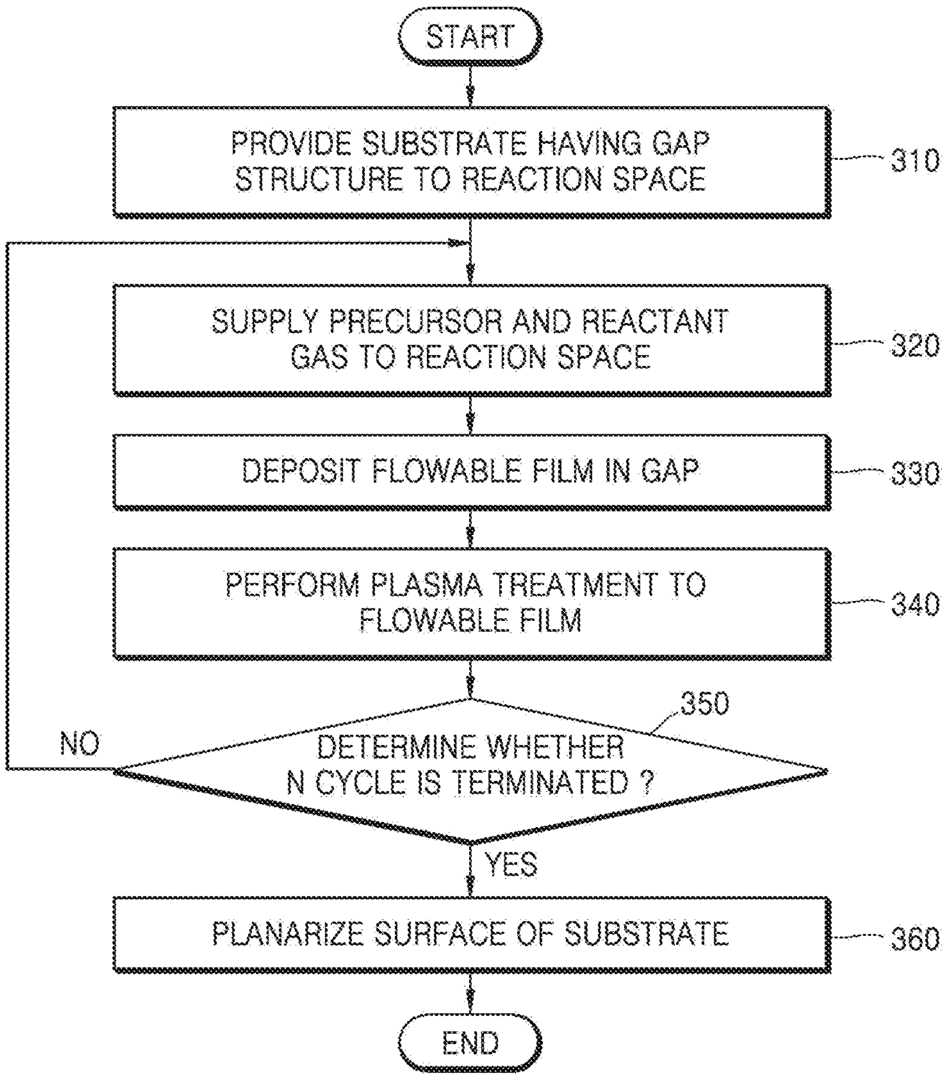
FIG. 6 is a process flow diagram illustrating a method for forming an air-gap in a gap according to example embodiments of the present disclosure.

FIG. 6 is a process flow diagram illustrating a method for forming an air-gap according to example embodiments of the present disclosure. Referring to FIG. 6, together with FIG. 2A to 2D, 3, and 5, the process flow of the method for forming the air-gap in the gap according to example embodiments of the present disclosure will be described.

First, the substrate 20 having the gap 22 structure in the reaction space (not shown) may be provided 310. The reaction space may be a reaction chamber that may perform a substrate processing process according to the example embodiments of the present disclosure. Specifically, the reaction space may be the plasma reaction chamber in which example embodiments of the present disclosure may be performed. Preferably, the reaction space may be the direct plasma reaction chamber that may generate plasma directly near the upper surface of the substrate 20.

Subsequently, a precursor and a reactant gas may be supplied to the reaction space to which the substrate 20 may be provided 320. As a precursor, a silicon-containing precursor may be used. The silicon-containing precursor may include, but is not limited thereto, amino-silane series, iodosilane series, silicon halide series and oligomer Si source. The reactant gas may include a nitrogen-containing gas, for example, $NH_3$ gas.

Subsequently, the flowable film 24 may be deposited in the gap 22 (330). The flowable film 24 may be deposited under the plasma environment generated by applying RF power to the reaction space while supplying the precursor and the reactant gas to the reaction space. The process time for depositing the flowable film 24 may be controlled so that the flowable film 24 may be formed on the exposed surface of the substrate 20 with an appropriate thickness. The deposition step of depositing the flowable film 330 may be performed substantially at the same step as the step of supplying the precursor and the reactant gas to the reaction space 320.

Subsequently, the plasma treatment may be performed to the flowable film 24 deposited on the surface of the substrate 340. The plasma treatment step 340 may be performed by generating plasma directly above the substrate 20 by applying RF power to the reaction space while supplying the inert gas such as helium gas toto the reaction space in a state in which the supply of the precursor and the reaction gas to be supplied to the reaction space may be stopped.

Subsequently, the number of repetitions of the step of supplying the precursor and the reactant gas 320, the step of depositing the flowable film 330, and the step of plasma treatment 340 may be predetermined to N cycles (wherein, N is a positive integer), and then it may be determined whether the number of repetitions thereof has reached N cycles 350. That is, the step of supplying the precursor and the reactant gas 320, the step of depositing the flowable film 330, and the step of plasma treatment 340 may be defined as one cycle, and the number of repetitions may be defined as N cycles (wherein N is a positive integer) until the flowable film 24 contacts each other in the upper region of the gap 22 and closes the upper region of the gap, so that the air-gap 26 may be sufficiently formed in the gap 22. The steps 320, 330, and 340, which may correspond the step of depositing the flowable film 24, may be repeated a plurality of times until the number of repetitions reaches N cycles. When performing the predetermined N cycles is terminated, a surface planarization process for the substrate 360 may be performed to remove the flowable film 24 remaining on the upper side of the gap 22. In one embodiment, a ratio of the process time of the deposition step 320 and 330 to the process time of the plasma treatment step 340 may be about 1:1 to about 100:1.

Next, the adjustment of the size, shape, and position, etc. of the air-gap 26 shown in FIG. 2D will be described in relation to process conditions.

As described above with reference to FIG. 2B, the flowable film 24 may flow from the upper region of the gap 22 to the lower region of the gap 22 due to the flowable properties of the flowable film 24. However, by performing the plasma treatment step to the flowable film 24 according to example embodiments of the present disclosure, which follows the deposition step of depositing the flowable film 24, the degree to which the flowable film 24 flows down to the lower region of the gap 22 may be controlled.

Specifically, after the flowable film 24 is formed by any thickness, the flowability of the flowable film 24 may be deteriorated by performing the plasma treatment to the flowable film 24 according to the present disclosure. That is, as conceptually shown in FIG. 2B, when the direct plasma treatment according to example embodiments of the present disclosure is performed to the flowable film 24 formed on the exposed surface of the substrate 20 in the deposition step described above, the flowable film 24 deposited in the upper region of the gap 22 having, in particular, a very large aspect ratio may be more affected by the plasma treatment compared to the flowable film 24 formed in the lower region of the gap 22, and as a result, the flowability of the flowable film 24 deposited in the upper region thereof may be relatively more deteriorated, and thus the flowability thereof may become relatively smaller. As a result, as shown in FIG. 2B, as the degree to which the flowable film 24 deposited in the upper region of the gap 22 flows down to the lower region of the gap 22 may decrease, the thickness of the flowable film 24 deposited in the upper region of the gap 22, that is, in the inlet region of the gap 22 may increase. Therefore, as the deposition step of the flowable film 24 and the plasma treatment step to the flowable film 24 are repeated according to example embodiments of the present disclosure, the upper region of the gap 22 may be preferentially closed by the flowable film 24, thereby forming the air-gap 26 in the gap 22.

On the other hand, the inventors of the present disclosure found that in the plasma treatment step to the flowable film 24, the flowability of the flowable film 24 may be controlled by adjusting some of the process conditions thereof. In particular, in the plasma treatment step to the flowable film 24, as the RF power applied to the reaction space increases, the flowable properties of the flowable film 24 may be more deteriorated and thus the flowability of the flowable film 24 may decrease. Specifically, in the plasma treatment step to the flowable film 24 according to example embodiments of the present disclosure, the RF power applied to the reaction space may be adjusted in a range of greater than 0 W to about 1500 W, for example, about 200 W to about 1000 W (see Table 1).

In the range of the RF power applied to the reaction space in the plasma treatment step according to the example embodiments of the present disclosure, assuming that a specific RF power to be referenced is a reference RF power, when the reference RF power is constantly applied during the plasma treatment, dimensions (e.g., Hb, HO, Ht, WO) that may define the air-gap 26 formed within the gap 22 are shown in FIG. 2D.

When it is assumed that the reference RF power is, for example, 500 W, as the RF power applied to the reaction space becomes greater than 500 W (e.g., 800 W), the flowability of the flowable film 24 may decrease, and as the RF power applied to the reaction space becomes less than 500 W (e.g., 300 W), the flowability of the flowable film 24 may increase. Therefore, during the same process time, as the RF power is greater than the reference RF power, the flowability of the flowable film 24 formed in the upper region of the gap 22 may be further reduced compared to a case where the reference RF power is applied, so that the upper region of the gap 22 is closed relatively quickly. This may result in an increase in the size of the air-gap 26 in the gap 22.

That is, referring to FIG. 2D, as the upper region of the gap 22 is closed relatively quickly, both the height Hb extending from a lower surface of the gap 22 to a lower end of the air-gap 26 and the height Ht extending from an upper surface of the gap 22 to an upper end of the air-gap 26 may become small, so that a vertical height H0 of the air-gap 26 may become large. In addition, as the upper region of the gap 22 is closed quickly, the deposition of the flowable film 24 in the side wall of the gap 22 may be insufficient, so that the thickness of the flowable film 24 on the side wall of the gap 22 may become small, and as a result, the width W0 of the air-gap 26 also may become large. Therefore, under the same process time conditions, when the RF power is greater than the reference RF power, the upper region of the gap 22 may be closed relatively quickly, and consequently the vertical height H0 and the width W0 of the air-gap 26 may increase, thereby increasing the size, that is, volume, of the air-gap 26.

On the other hand, under the same process time conditions, when the RF power is less than the reference RF power, the flowability of the flowable film 24 formed in the upper region of the gap 22 may further increase compared to the case where the reference RF power is applied to the gap 22, and thus, the upper region of the gap 22 may be closed relatively slowly. As the upper region of the gap 22 is closed relatively slowly, both the height Hb and the height Ht in FIG. 2D may become large, and thus, the vertical height H0 of the air-gap 26 may become small. In addition, at this case, the flowable film 24 may be formed in sufficient thickness on the side wall of the gap 22, and thus, the width W0 of the air-gap 26 may be also small. Therefore, under the same process time conditions, when the RF power is less than the reference RF power, the upper region of the gap 22 may be closed relatively slowly, and consequently the height H0 and the width W0 of the air-gap 26 may decrease, thereby decreasing the size, that is, volume, of the air-gap 26.

On the other hand, in the plasma treatment step according to the example embodiments of the present disclosure, the RF power may be applied to the reaction space while changing the RF power. For example, the RF power may increase linearly or nonlinearly, or may decrease linearly or nonlinearly during the plasma treatment step according to the present disclosure. In some embodiments, a first RF power in a first plasma treatment step may be maintained greater than the reference RF power, and then a second RF power in a second plasma treatment step may be maintained less than the reference RF power. On the contrary, the first RF power in the first plasma treatment step may be maintained less than the reference RF power, and then the second RF power in the second plasma treatment may be maintained greater than the reference RF power. For example, when the RF power is maintained less than the reference RF power for a certain period of time during the plasma treatment step, and then is maintained greater than the reference RF power, a greater amount of the flowable film 24 may be formed in the lower region of the gap 22 while the RF power is maintained less than the reference RF power. In this case, the height Hb shown in FIG. 2D may increase. That is, the position of the lower end of the air-gap 26 may get higher within the gap 22. On the contrary, when the RF power is maintained greater than the reference RF power for a certain period of time during the plasma treatment step, and then is maintained less than the reference RF power, a relatively small amount of the flowable film 24 may be formed in the lower region of the gap 22 while the RF power is maintained greater than the reference RF power. In this case, the height Hb shown in FIG. 2D may decrease. That is, the position of the lower end of the air-gap 26 may get lower within the gap 22.

In addition, similarly, the height Ht shown in FIG. 2D may be adjusted by performing the plasma treatment step while maintaining the RF power to be applied to the reaction space greater or less than the reference RF power. That is, when the RF power is maintained relatively greater than the reference RF power, the Ht may be small (i.e., the position of the upper end of the air-gap 26 may get higher in the gap 22), on the contrary, when the RF power is maintained relatively less than the reference RF power, the Ht may be large (i.e., the position of the upper end of the air-gap 26 may get lower in the gap 22).

From the above, when plasma treatment step is performed to the flowable film 24 under the conditions of the same process time, the RF power may be relatively adjusted to control radical-based reactions for each position within the gap, thereby adjusting the size (e.g., the height H0, the width W0, or the volume of the air-gap), the shape (e.g., the ratio of the width to the height of the air-gap 26), or the vertical position (e.g., the vertical position of the air-gap within the gap 22), etc. of the air-gap 26.

On the other hand, as a volume ratio of the air-gap having a relatively low dielectric constant in an insulating film increases, the RC delay in the semiconductor device may be reduced to speed up the speed of the signal transmission. However, it is also necessary to prevent the occurrence of dielectric breakdown, in order to maintain the insulating properties of an insulating film in the semiconductor device. Thus, in order to speed up the speed of the signal transmission while maintaining the insulating properties of the insulating film in semiconductor device, the size occupied by the air-gap in the gap, for example, the volume ratio, may be controlled by optimizing the intensity of RF power.

Figure 4:
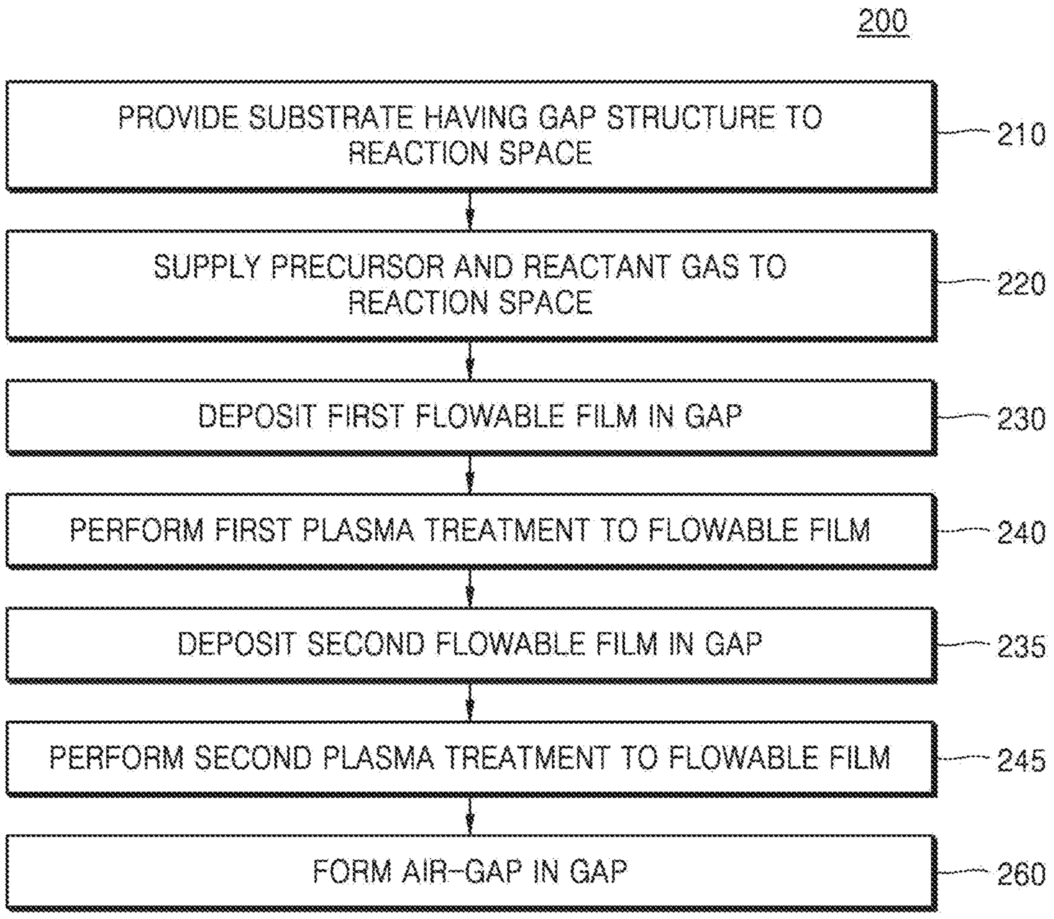
FIG. 4 is a flow chart illustrating a process of forming an air-gap in a gap according to other example embodiments of the present disclosure.

FIG. 4 is a flow chart illustrating a process 200 of forming an air-gap in a gap according to other example embodiments of the present disclosure. The process of forming the air-gap in the gap according to other example embodiments of the present disclosure may be substantially the same as the air-gap formation process of FIG. 3, except that the deposition step of depositing a flowable film may be divided into a first deposition step of depositing a first flowable film and a second deposition step of depositing a second flowable film, and the plasma treatment step to the flowable film may be divided into a first plasma treatment step and a second plasma treatment step. A description overlapping the description of FIG. 3 will be omitted as much as possible. In addition, for the convenience of explanation, it will be described with reference to FIGS. 2A to 2D.

First, the substrate 20 having the gap 22 structure may be provided to the reaction space (not shown) 210. The reaction space may be, for example, the direct plasma reaction chamber that may generate plasma directly near the upper surface of the substrate 20.

Subsequently, the precursor and the reactant gas may be supplied to the reaction space to which the substrate 20 may be provided 220. As the precursor, a silicon-containing precursor may be used. In some embodiments, the precursor containing a silicon may include at least one of amino silane series, iodosilane series, and silicon halide series and oligomer SI source. The reactant gas may be nitrogen-containing gas such as $NH_3$ gas.

Subsequently, under a first deposition process conditions (e.g., a first deposition RF power, a first deposition process pressure, a first deposition process temperature, a first deposition process gas, etc.), a first flowable film 24 may be deposited in the gap 230. The first flowable film 24 may be deposited under a plasma environment generated by applying the first deposition RF power to the reaction space while supplying the precursor and the reactant gas to the reaction space. The process time for the first deposition step of depositing the first flowable film 24 may be controlled so that the first flowable film 24 may be formed on the exposed surface of the substrate 20 with an appropriate thickness. The first deposition step of forming the first flowable film 230 may be performed substantially at the same step as the step of supplying the precursor and the reactant gas to the reaction space 220.

Subsequently, under a first plasma treatment process conditions (e.g., a first plasma treatment RF power, a first plasma treatment process pressure, a first plasma treatment process temperature, a first plasma treatment process gas, etc.), the first plasma treatment 240 may be performed to the flowable film 24 formed on the surface of the substrate 20. The first plasma treatment step may be performed by generating plasma directly above the substrate 20 by applying the first plasma treatment RF power to the reaction space while supplying the inert gas such as helium gas to the reaction space in a state in which the supply of the precursor and the reaction gas to be supplied to the reaction space may be stopped.

Subsequently, under a second deposition process conditions (e.g., a second deposition RF power, a second deposition process pressure, a second deposition process temperature, a second deposition process gas, etc.), a second flowable film 24 may be deposited in the gap 235. The second flowable film 24 may be deposited under a plasma environment generated by applying the second deposition RF power to the reaction space while supplying the precursor and the reactant gas to the reaction space. For example, the second deposition process conditions may be preferably the same as the first deposition process conditions in terms of maintaining the sameness, but this does not exclude that some process conditions may be different. The second deposition step of depositing the second flowable film 235 may be performed substantially at the same step as the step of supplying the precursor and the reactant gas to the reaction space.

Subsequently, under second plasma treatment process conditions (e.g., a second plasma treatment RF power, a second plasma treatment process pressure, a second plasma treatment process temperature, a second plasma treatment process gas, etc.), the second plasma treatment may be performed 245 to the flowable film 24 deposited on the surface of the substrate 20. The second plasma treatment process conditions may be different from the first plasma treatment process conditions. For example, as described above, in order to control the size, the shape, and the vertical position of the air-gap 26 formed in the gap 22, the second plasma treatment RF power may be the same as the first plasma treatment RF power, or greater or less than the first plasma treatment RF power, as needed. The second plasma treatment process pressure, the second plasma treatment process temperature, and the second plasma treatment gas, and the like may be the same as or different from the first plasma treatment process pressure, the first plasma treatment process temperature, and the first plasma treatment gas, and the like.

Subsequently, as a result of repeating the first deposition step, the first plasma treatment step, the second deposition step and the second plasma treatment step, the air-gap 26 may be formed 260 in the gap 22. After the desired air-gap 26 is formed, as needed, the surface planarization process of removing a portion of the flowable film 24 remaining on the upper side of the gap 22 structure, may be performed to expose the surface of the substrate 20.

On the other hand, when the first deposition process conditions are the same as the second deposition process conditions, and the first plasma treatment process conditions are the same as the second plasma treatment process conditions, it may be said that the process of forming the air-gap of FIG. 4 may be the same as the process of forming the air-gap of FIG. 3.

Figure 7:
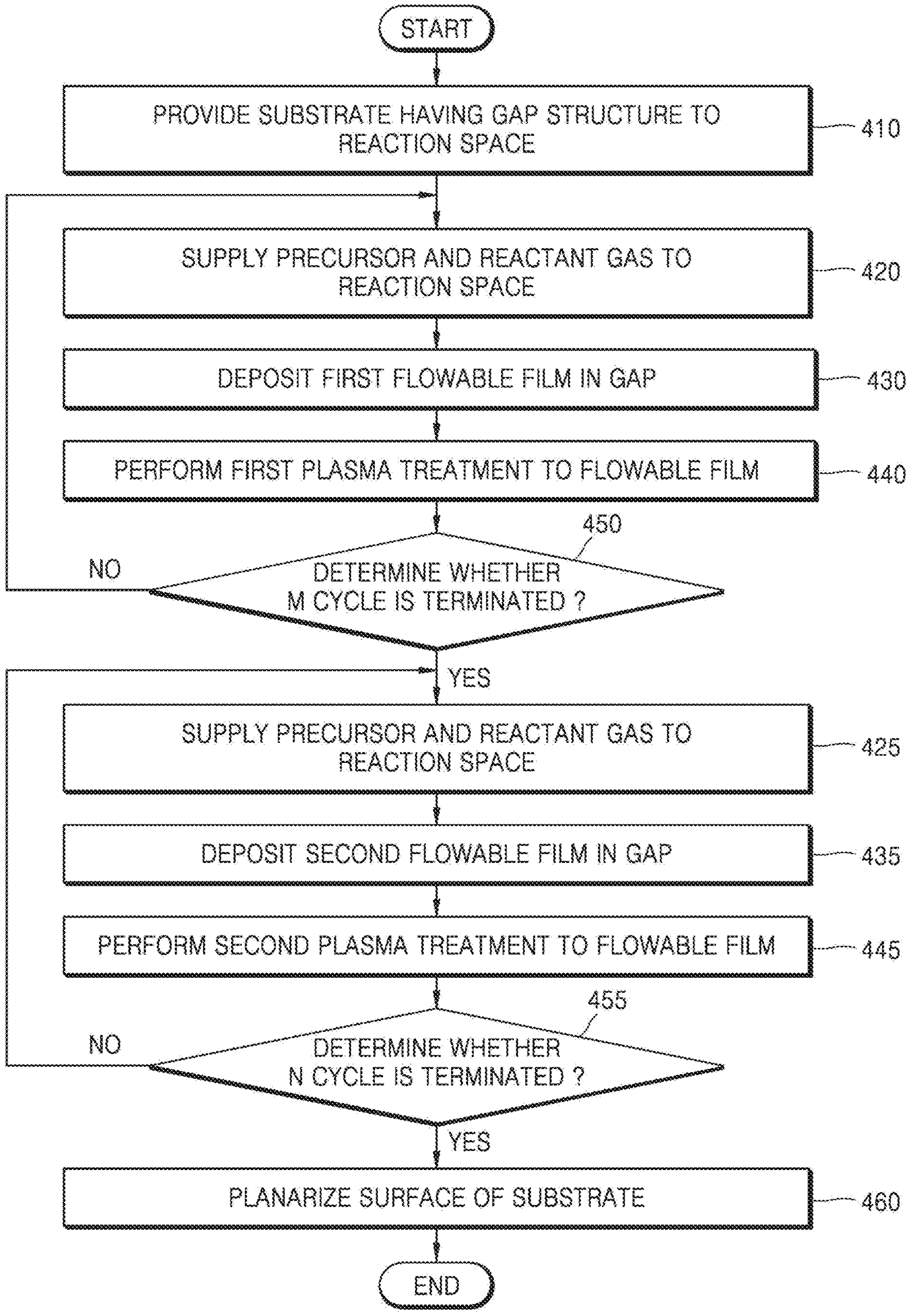
FIG. 7 is a process flow diagram illustrating a method for forming an air-gap in a gap according to other example embodiments of the present disclosure.

FIG. 7 is a process flow diagram illustrating a method of processing a substrate according to other example embodiments of the present disclosure. The process flow diagram of the substrate processing method according to example embodiments of the present disclosure shown in FIG. 7 reflects the flow chart illustrating the air-gap forming process of FIG. 5. Referring to FIG. 7, together with FIGS. 2A to 2D, 4, and 5, the process flow of the method for forming the air-gap in the gap according to example embodiments of the present disclosure will be described.

First, the substrate 20 having the gap 22 structure may be provided to the reaction space (not shown) 410. The reaction space may be, for example, a direct plasma reaction chamber that may generate plasma directly near the upper surface of the substrate 20.

Subsequently, the precursor and the reactant gas may be supplied to the reaction space in which the substrate 20 is provided 420. As the precursor, a silicon-containing precursor may be used. The silicon-containing gas may be at least one of amino-silane series, iodosilane series, silicon halide series and oligomer Si source may be used. The reactant gas maybe a nitrogen-containing gas. For example, $NH_3$ gas may be used as the reactant gas.

Subsequently, a first flowable film 24 may be deposited 430 in the gap 22. The first flowable film 24 may be deposited under a plasma environment generated by applying the first deposition RF power to the reaction space while supplying the precursor and the reactant gas to the reaction space. The process time for forming the first flowable film 24 may be controlled so that the first flowable film 24 may be formed on the exposed surface of the substrate 20 with an appropriate thickness. The first deposition step of forming the first flowable film 430 may be performed substantially at the same step as the step of supplying the precursor and the reactant gas to the reaction space 420.

Subsequently, the first plasma treatment step may be performed to the first flowable film 24 deposited on the surface of the substrate 440. The first plasma treatment step may be performed by generating plasma directly above the substrate 20 by applying RF power to the reaction space while supplying the inert gas such as helium gas to the reaction space in a state in which the supply of the precursor and the reaction gas to be supplied to the reaction space may be stopped.

Subsequently, the number of repetitions of the step of supplying the precursor and the reactant gas 420, the step of depositing the first flowable film 430, and the step of performing a plasma treatment 440 may be predetermined to M cycles (wherein, M is a positive integer), and then it may be determined whether the number of repetitions thereof reached M cycles 450. That is, the step of supplying the precursor and the reactant gas 420, the step of depositing the first flowable film 430, and the step of performing a plasma treatment 440 may be defined as one cycle, and the predetermined M cycles may be terminated before the upper region, that is, the inlet region of the gap is closed by the first flowable film 24 contacting each other in the inlet region of the gap 22.

Subsequently, when the predetermined M cycles are terminated, the precursor and the reactant gas may be again supplied to the reaction space provided with the substrate 425.

Subsequently, a second flowable film 24 may be deposited 435 in the gap 22. The second deposition process conditions (for example, the second deposition RF power, the second deposition process pressure, the second deposition process temperature, the second deposition process gas, etc.) may be preferably the same as the first deposition process conditions for forming the first flowable film (for example, the first deposition RF power, the first deposition process pressure, the first deposition process temperature, the first deposition process gas, etc.) in terms of maintaining the sameness, but this does not exclude that some process conditions may be different. The second deposition step of the second flowable film 435 may be performed substantially at the same step as the step of supplying the precursor and the reactant gas to the reaction space 425.

Subsequently, the second plasma treatment step may be performed to the flowable film 24 deposited on the surface of the substrate 445. The second plasma treatment step may be performed by generating plasma directly above the substrate 20 by applying RF power to the reaction space while supplying the inert gas such as helium gas, to the reaction space in a state in which the supply of the precursor and the reaction gas to be supplied to the reaction space may be stopped. The second plasma treatment process conditions (for example, the second plasma treatment RF power, the second plasma treatment process pressure, the second plasma treatment process temperature, the second plasma treatment process gas, etc.) may be the same as, or different from the first plasma treatment process conditions (for example, the first plasma treatment RF power, the first plasma treatment process pressure, the first plasma treatment process temperature, the first plasma treatment process gas, etc.). For example, as described above, in order to control the size, the shape, and the vertical position of the air-gap 26 formed in the gap 22, the second plasma treatment RF power may be the same as the first plasma treatment RF power, or greater or less than the first plasma treatment RF power, as needed.

Subsequently, the number of repetitions of the step of supplying the precursor and the reactant gas 425, the step of depositing the second flowable film 435, and the step of performing plasma treatment 445 may be predetermined to N cycles (wherein, N is a positive integer), and then it may be determined whether the number of repetitions thereof reached N cycles 455. The step of supplying the precursor and the reactant gas 425, the step of depositing the second flowable film 435, and the step of performing a plasma treatment 445 may be defined as one cycle, and the N cycles may be repeated until the upper region, that is, the inlet region of the gap 22 is closed by the flowable film 24 contacting each other in the inlet region of the gap 22.

On the other hand, for example, in order to control the size, the shape, and the vertical position of the air-gap, as needed, the N cycle may be terminated before the inlet region of the gap 22 is closed and then the M cycle may be again repeated. When performing the predetermined N cycles is terminated, a surface planarization process for the substrate may be performed 460 to remove the flowable film 24 remaining on the upper side of the gap 22.

In another optional embodiment, in the first deposition steps 420 and 430 and the first plasma treatment step 440, a flowable gap-fill process may be performed until a predetermined width of the flowable film is achieved before the inlet region of the gap is closed, and then, in the second deposition steps 425 and 435 and the second plasma treatment step 445, the flowable gap-fill process may be performed so that the inlet region of the gap is completely closed. Therefore, in order to form the air-gap with a more precise shape, the deposition and the plasma treatment step may be precisely controlled in the inlet region of the gap.

Figure 8:
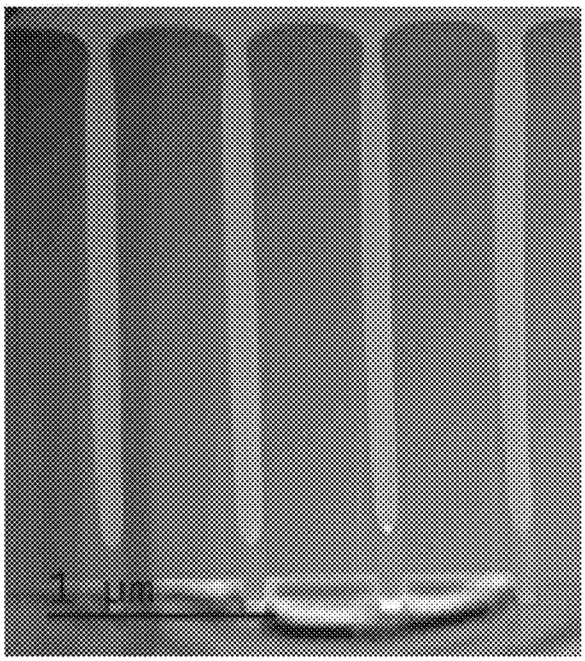
FIG. 8 is a TEM photograph for comparing with a result of a method for forming an air-gap in a gap according to example embodiments of the present disclosure.
Figure 9:
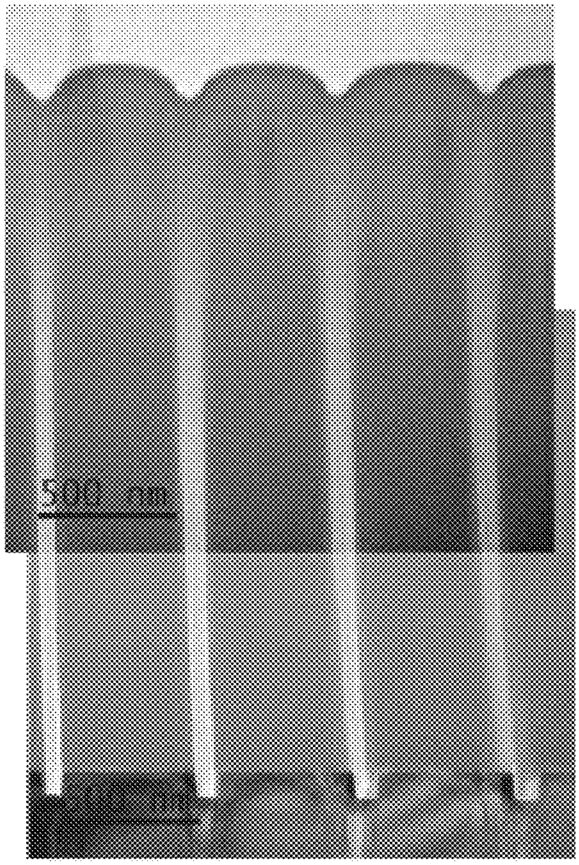
FIG. 9 is another TEM photograph for comparing with a result of a method for forming an air-gap in a gap according to example embodiments of the present disclosure.
Figure 10:
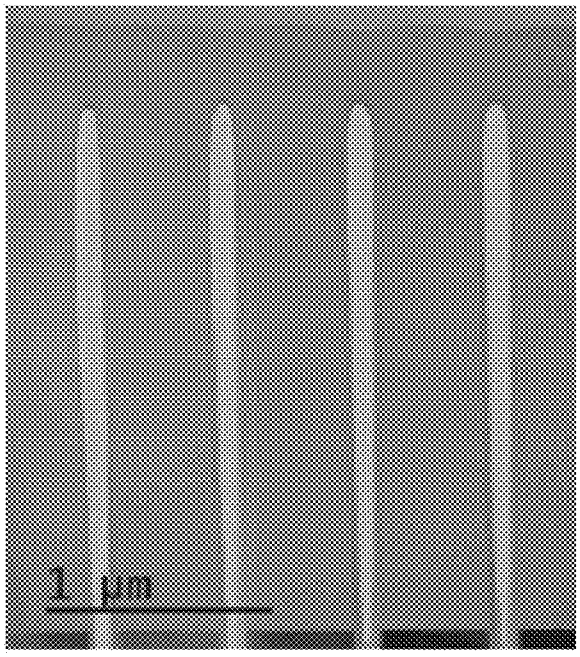
FIG. 10 is a TEM photograph of a result of a method for forming an air-gap in a gap according to example embodiments of the present disclosure.

FIG. 8 is a TEM photograph for comparing with a result of a method for forming an air-gap according to example embodiments of the present disclosure. FIG. 9 is another TEM photograph for comparing with a result of a method for forming an air-gap according to example embodiments of the present disclosure. FIG. 10 is a TEM photograph of a result of a method for forming an air-gap according to example embodiments of the present disclosure. The TEM photographs of FIGS. 8 and 9 are comparative examples for comparing to the air-gap formed according to example embodiments of the present disclosure, shown in FIG. 10.

FIGS. 8, 9 and 10 are test results on trench patterns having depths of about 2.5 μm and high aspect ratios of 1:25. Both the case of FIG. 8 and the case of FIG. 9 are results of performing only the deposition step of depositing the flowable film, without performing the plasma treatment step to the flowable film according to the present disclosure.

FIG. 8 shows a result of performing the deposition step of depositing the flowable film for hundreds of seconds, and shows that a thin film of about 20 nm or less thickness is deposited on the side wall of the trench pattern, the thin film of about 500 nm thickness is deposited on the lower region of the pattern during the same time, and the thin film of about 100 nm or less thickness is deposited on a pattern structure between trenches. As shown in FIG. 8, an inlet of the gap is not closed.

FIG. 9 shows that as a result of continuing the deposition step of depositing a flowable film for a long time, for example, several times longer than the time in FIG. 8, a porous flowable film is gap-filled without the occurrence of voids in the trench pattern overtime. As shown in FIG. 9, an inlet of the gap is still not closed even though the time for forming the flowable film gets longer.

FIG. 10 shows that as a result of performing a helium plasma treatment step to the flowable film after the deposition step of depositing the flowable film according to example embodiments of the present disclosure, by deteriorating the flowability of the flowable film while densifying the flowable film in the upper region of the gap through the helium direct plasma treatment, the flowable film does not flow down toward in the trench pattern, and therefore the flowable film is mainly deposited on the upper side of the trench pattern and the flowable film is very thinly formed on the side wall and the lower side of the trench pattern, and consequently, the upper side of the trench pattern is closed as the process progresses and the air-gap is formed inside the trench pattern.

It will be obvious by those of ordinary skill in the art that the present disclosure described above is not limited to the above-described embodiments and accompanying drawings, and that various substitutions, modifications, and changes are possible without departing from the scope and sprit of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of processing a substrate, the method comprising:

providing the substrate where a gap is formed on a surface thereof to a reaction space;

performing a first deposition step of depositing a flowable film in the gap of the substrate while supplying a precursor and a reactant gas to the reaction space;

performing a first plasma treatment step to the flowable film so that a flowability of the flowable film in an upper region of the gap is different from the flowability of the flowable film in a lower region of the gap;

performing a second deposition of depositing the flowable film in the gap of the substrate while supplying the precursor and the reactant gas to the reaction space;

performing a second plasma treatment step to the flowable film so that the flowability of the flowable film in the upper region of the gap is different from the flowability of the flowable film in the lower region of the gap; and repeating the first deposition step, the first plasma treatment step, the second deposition step, and the second plasma treatment step, to form an air-gap in the gap, wherein the first plasma treatment step and the second plasma treatment step are different, wherein both the first plasma treatment step and the second plasma treatment step are performed to decrease the flowability of the flowable film in the upper region of the gap compared to the lower region of the gap, and wherein the degree of decrease in the flowability of the flowable film in the upper region of the gap in the second plasma treatment step is greater compared to the first plasma treatment step.

2. The method of processing a substrate of claim 1, wherein at least one of the first plasma treatment step and the second plasma treatment step is performed so that the flowability of the flowable film in the upper region of the gap decreases compared to the flowability of the flowable film in the lower region of the gap.

3. The method of processing a substrate of claim 1, wherein a second RF power applied to the reaction space in the second plasma treatment step is greater than a first RF power applied to the reaction space in the first plasma treatment step.

4. The method of processing a substrate of claim 1, wherein, in the first plasma treatment step and the second plasma treatment step, a direct plasma treatment is performed while supplying an inert gas to the reaction space.

5. The method of processing a substrate of claim 1, wherein the precursor supplied to the reaction space comprises a silicon-containing precursor and the reactant gas comprises a nitrogen-containing gas.

6. The method of processing a substrate of claim 5, wherein the silicon-containing precursor comprises at least one of amino-silane series, iodosilane series, silicon halide series, and oligomer Si source, or at least one of mixtures thereof.

7. The method of processing a substrate of claim 6, wherein the silicon-containing precursor comprises at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; Dimer-trisilylamine; Trimer-trisilylamine; Tetramer-trisilylamine; Pentamer-trisilylamine; Hexamer-trisilylamine; Heptamer-trisilylamine; and Octamer-trisilylamine, or at least one of derivatives thereof or mixtures thereof.

8. The method of processing a substrate of claim 5, wherein the nitrogen-containing gas comprises at least one selected from $N_2$, $N_2O$, $NO_2$, $NH_3$, $N_2H_2$, $N_2H_4$, at least one of radicals thereof, and mixtures thereof.

9. The method of processing a substrate of claim 1, wherein the first deposition step and the second deposition step of depositing the flowable film are performed in a range of a process temperature between about 0° C. and about 150° C.

10. The method of processing a substrate of claim 1, wherein the first deposition step, the first plasma treatment step, the second deposition step, and the second plasma treatment step are continuously performed.

11. The method of processing a substrate of claim 1, wherein, after the first deposition step and the first plasma treatment step are continuously performed for M cycle (Mis a positive integer), the second deposition step and the second plasma treatment step are continuously performed for N cycle (N is a positive integer).

12. The method of processing a substrate of claim 1, further comprising performing a purge/pumping step at least one of after the first deposition step and before the first plasma treatment step, or after the second deposition step and before the second plasma treatment step.

13. The method of processing a substrate of claim 1, wherein the plasma treatment step is performed by supplying an inert gas to the reaction space in a state in which the supply of the precursor and the reactant gas to be supplied to the reaction space may be stopped.

14. A method of processing a substrate, the method comprising:

providing the substrate where a gap is formed on a surface thereof in a reaction space;

performing a deposition step of depositing a flowable film in the gap of the substrate while supplying a precursor and a reactant gas to the reaction space;

performing a plasma treatment step to the flowable film so that the flowability of the flowable film in an upper region of the gap decreases compared to a lower region of the gap;

adjusting at least one of a size, a shape, and a position of an air-gap by adjusting an RF power applied to the reaction space compared to a reference RF power; and repeating the deposition step of depositing the flowable film and the plasma treatment step to the flowable film, to form the air-gap within the gap.

15. The method of processing a substrate of claim 14, wherein, in the plasma treatment step, a vertical position of the air-gap in the gap is adjusted by adjusting the RF power applied to the reaction space compared to the reference RF power.

16. The method of processing a substrate of claim 15, wherein, in the plasma treatment step, a height between an upper end of the air-gap and an upper surface of the gap is adjusted by adjusting the RF power applied to the reaction space compared to the reference RF power.

17. The method of processing a substrate of claim 15, wherein, in the plasma treatment step, a height between a lower end of the air-gap and a bottom surface of the gap is adjusted by adjusting the RF power applied to the reaction space compared to the reference RF power.

18. The method of processing a substrate of claim 14, wherein, in the plasma treatment step, a width of the air-gap in the gap is adjusted by adjusting the RF power applied to the reaction space compared to the reference RF power.

19. The method of processing a substrate of claim 14, wherein, in the plasma treatment step, the RF power applied to the reaction space is in a range of about 200 W to about 1000 W.

20. The method of processing a substrate of claim 14, wherein the ratio of the process time of the deposition step to the process time of the plasma treatment step is between about 1:1 to about 100:1.

21. The method of processing a substrate of claim 14, wherein the deposition step of the flowable film and the plasma treatment step to the flowable film are performed in a range of a process temperature between about 0° C. and about 150° C.

22. A method of processing a substrate, the method comprising:

providing the substrate where a gap is formed on a surface thereof to a reaction space;

performing a first deposition step of depositing a flowable film in the gap of the substrate while supplying a precursor and a reactant gas to the reaction space;

performing a first plasma treatment step to the flowable film so that a flowability of the flowable film in an upper region of the gap is different from the flowability of the flowable film in a lower region of the gap;

performing a second deposition of depositing the flowable film in the gap of the substrate while supplying the precursor and the reactant gas to the reaction space;

performing a second plasma treatment step to the flowable film so that the flowability of the flowable film in the upper region of the gap is different from the flowability of the flowable film in the lower region of the gap; and repeating the first deposition step, the first plasma treatment step, the second deposition step, and the second plasma treatment step, to form an air-gap in the gap, wherein the first plasma treatment step and the second plasma treatment step are different, wherein both the first plasma treatment step and the second plasma treatment step are performed to decrease the flowability of the flowable film in the upper region of the gap compared to the lower region of the gap, and wherein the degree of decrease in the flowability of the flowable film in the upper region of the gap in the second plasma treatment step is less compared to the first plasma treatment step.

23. The method of claim 22, wherein a second RF power applied to the reaction space in the second plasma treatment step is less than a first RF power applied to the reaction space in the first plasma treatment step.

* * * * *